(12) United States Patent
Tseng

(10) Patent No.: US 6,294,471 B1
(45) Date of Patent: Sep. 25, 2001

(54) METHOD OF ELIMINATING DISHING EFFECT IN POLISHING OF DIELECTRIC FILM

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/672,129

(22) Filed: Sep. 27, 2000

(51) Int. Cl.⁷ .................... H01L 21/302; H01L 21/461
(52) U.S. Cl. ............................. 438/692; 438/782
(58) Field of Search ........................... 438/631, 692, 438/697, 699, 781, 782, 710, 714

(56) References Cited

U.S. PATENT DOCUMENTS 5,366,850 * 11/1994 Chen et al. ........................ 438/314
5,399,533 * 3/1995 Pramanik et al. .................. 156/643
5,821,163 * 10/1998 Harvey et al. ...................... 438/631
5,930,677 * 7/1999 Zheng et al. ....................... 438/782

\* cited by examiner

Primary Examiner—David Nelms
Assistant Examiner—David Nhu
(74) Attorney, Agent, or Firm—Blakely Sokoloff Taylor & Zafman LLP

(57) ABSTRACT

A spin-on-material is coated over a conductive structure having a narrow and wide gaps formed between thereof. The layer may be used as polishing stop layer that can prevent slurry or polishing pad from reaching the region in the wide gap, thereby eliminating the dishing effect. In a preferred embodiment, the polishing stop layer is composed of thin spin-on-material such as silicate-type spin-on-glass, and the spin-on-material is diluted in commercial chemical called thinner. Then, a thermal treatment is used to convert the spin-on-glass into silicon dioxide at a temperature about 100 to 400 centigrade degrees. Then, a CMP is used to polish the spin-on-material.

9 Claims, 2 Drawing Sheets

METHOD OF ELIMINATING DISHING EFFECT IN POLISHING OF DIELECTRIC FILM

FIELD OF THE INVENTION

The present invention relates generally to semiconductor processing, and more specifically, to a method of eliminating dishing effect.

BACKGROUND OF THE INVENTION

With the rapid development of integrated circuits technologies, there has been a trend to reduce the scale of a device. Thus, semiconductor technologies have increased the integrated circuit density on a chip. The semiconductor devices manufactured in and on the semiconductor substrate are very closely spaced. The alignment, lithography technologies are more important than ever due to the density of the packing density is continuously increased. Especially, the tolerance of self-align contact process is degrade, it is because that the contact window is reduced by scaling down the dimension of the features formed on a wafer.

Many devices includes conductive lines or structure for performing certain function, such as a bit line contact and a storage node contact must all be formed in a DRAM unit cell. In addition, multi-level interconnections are widely used in the advanced semiconductor device. Each device requires interconnections for exchanging electrical signals from one device to another device. Specially, the high performance integrated circuits have multi-level connections separated by dielectric layers. As the feature of the circuits is shrinkage, the need for decreasing the electrical resistance associated with electrical connection or contact becomes more important than ever. The higher of the resistance, the slower is the circuits operating speed limited by the RC delay.

An interconnection can be formed by forming a metal in a trench of an isolation layer. Then, the metal layer is polishing by chemical mechanical polishing (CMP). However, the CMP process suffers an issue called "dishing effect". The dishing effect is generated when the CMP performs on the metal layer formed over openings having different width, The surface of the metal is recessed below the interlayer in a dish shape in wider opening. This is unexpected result. During the polish, the polish pad usually reaches into the material formed in wide opening to remove material within the recess resulting in dishing. In contrast, narrow openings are polished without any dishing. The dishing structure is generated over the wide opening region, the effect may be caused by the slurry and the polished pad reach into the wide opening.

FIG. 1 illustrates a semiconductor substrate 10 having a plurality of conductive structure 12 formed thereon with narrow gap 14a and wide gap 14b formed between the structures. The conductive structure 12 requires dielectric or isolation layer formed over the conductive structure 12. FIG. 2 illustrates the structure of FIG. 1 after a layer 16 of material is formed thereon. The resulting substrate thus has an uneven topography. The layer 16 has an upper surface, which has a profile which is dictated by the topography of the substrate. High surfaces 22 of the surface are located above the conductive structure and the surface has lower surfaces 24 in the region of the gaps 14a, 14b.

Turning to FIG. 3, a polishing step is carried out until the conductive structures 12 are exposed by chemical mechanical polishing (CMP). CMP causes the high surfaces 22 to be removed. However, some of the material of the lower surfaces 24 is also removed so that topography of the layer before polishing is reflected on the structure after polishing. An upper surface of the structure after polishing thus has a profile with a dish 18 over the wide gap region. Because the width of the gap is different, the dishing effect will occur, which is a characteristic of the chemical mechanical polishing. As a result, dielectric over the wide gap 14b results in more over polishing than other area.

Thus, it is desirable to minimize or reduce dishing during the chemical-mechanical polishing of a wide integrated circuit feature.

SUMMARY OF THE INVENTION

An object of the present invention is to eliminating the dishing effect generated by CMP during the formation of metal structure.

The present invention comprises patterning a conductive structure having a first gap with first width and a second gap with second width formed between thereof, wherein the first width is wider than the second width. Then, a spin-on-material is coated on the conductive structure. Next, thermal treatment is used to convert the spin-on-material into an oxide, thereby forming the lowest surface over the first gap is higher than the surface of the conductive structure. A polishing is carried out to polish the spin-on-material by chemical mechanical polishing. Wherein the second gap can be planarized such that its top surface is substantially planar with the top surface of the conductive structure. A first portion of said spin-on-material over the second gap is completely removed, a second portion of the spin-on-material remains over the first gap, thereby reducing dishing effect.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
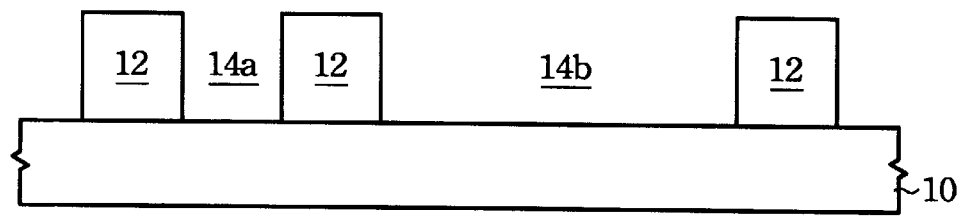
FIG. 1 is a cross section view of a semiconductor wafer illustrating a conductive structure in accordance with the prior art.
Figure 2:
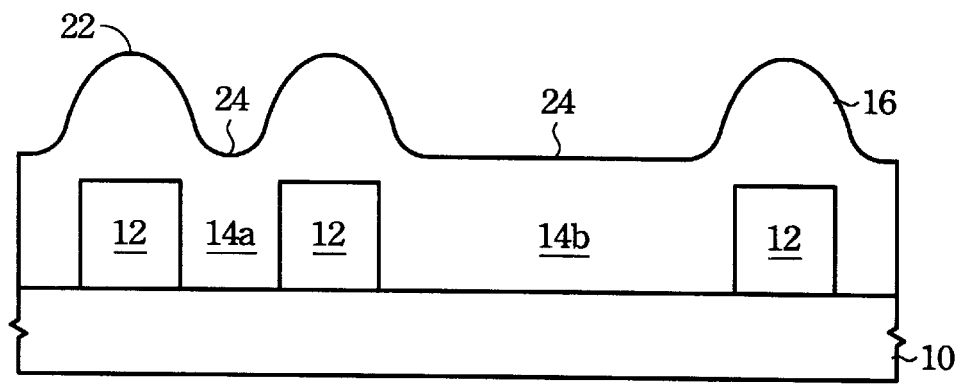
FIG. 2 is a cross section view of a semiconductor wafer illustrating the step of forming a dielectric layer in accordance with the prior art.
Figure 3:
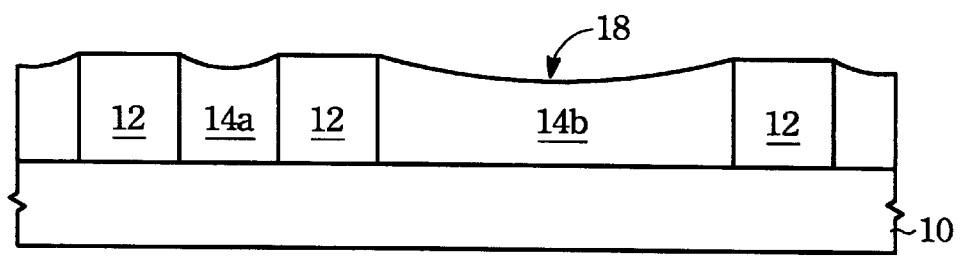
FIG. 3 is a cross section view of a semiconductor wafer illustrating the step of polishing, a dishing effect is occurred in accordance with the prior art.
Figure 4:
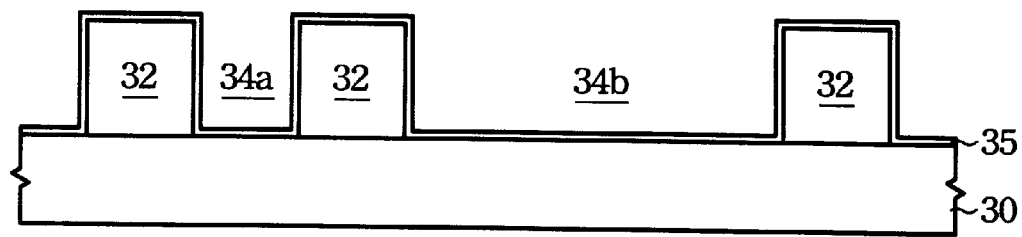
FIG. 4 is a cross section view of a semiconductor wafer illustrating the step of forming conductive structure which includes narrow and wide gaps in accordance with the present invention.
Figure 5:
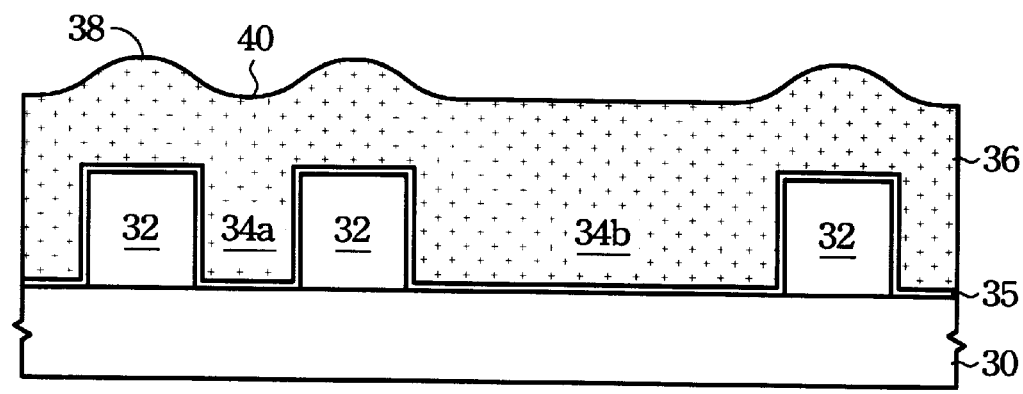
FIG. 5 is a cross section view of a semiconductor wafer illustrating the step of forming spin-on-glass in accordance with the present invention.

A method is disclosed to eliminating the dishing effect generated by CMP for manufacturing the conductive structure. As will be seen below, this technique can be used for manufacturing metal structure of integrated circuits. Referring to FIG. 4, in the preferred embodiment, a semiconductor wafer, such as a silicon wafer 30 with <100> crystallographic orientation is provided. As known in the art, it could be GaAs, Ge and so on. FIG. 4 is a cross-sectional view illustrating an embodiment of the present invention. A metal or conductive structure 32 is patterned over a substrate 30 or above other insulating layer or metal layer formed over the substrate 30. The conductive structure 30 may be selected from the group consisting of aluminum, copper, tungsten, silver, gold, copper, refractory metal and the combination thereof. In one embodiment, conductive structure 30 is preferably formed of a copper alloy or an aluminum alloy. As seen in the illustration, the semiconductor substrate 30 has a number of conductive structures 32 formed thereon with narrow gap 34 (or spacing) and wide gap (or spacing) 34 formed between the members. A thin dielectric layer 35 is next deposited along the surface of the substrate 30 and the conductive structure 32. The dielectric layer 35 can be silicon dioxide, silicon nitride, oxynitride or any other dielectric.

Turning to FIG. 4, a spin-on-material 36 is coated over the above structure, which reduces the degree of the uneven topography. The layer has an upper surface which has a high surfaces 38 of the surface are located above the conductive structure and the surface has lower surfaces 40 in the region of the gaps. The step difference between the two surfaces 38, 40 is smaller than the prior art. The layer may be used as polishing stop layer that can prevent slurry or polishing pad from reaching the region in the wide gap, thereby eliminating the dishing effect. Further, the pattern density is a further reason to cause the dishing effect. The area above the wide gap may be polished faster than other areas. The major reason to cause the dishing effect is that the wide gap region may be attacked by the slurry or pad during the polishing. The spin-on-material 36 provides the benefit of that the lowest surface of the layer is higher than the surface of the conductive structure. It may provide a buffer or polishing stop during the polishing the topography. In a preferred embodiment, the polishing stop layer is composed of thin spin-on-material such as silicate-type spin-on-glass, and the spin-on-material is diluted in commercial chemical called thinner. The thickness of the thin spin-on-glass 36 is about 500–3000 angstroms on horizontal planar surface. Then, a thermal treatment is used to convert the spin-on-glass into silicon dioxide at a temperature about 100 to 400 centigrade degrees. The thickness of the spin-on-glass 36 over the wide gap 34b is thicker than that of spin-on-glass 36 over the surface of the conductive layer 32.

Figure 6:
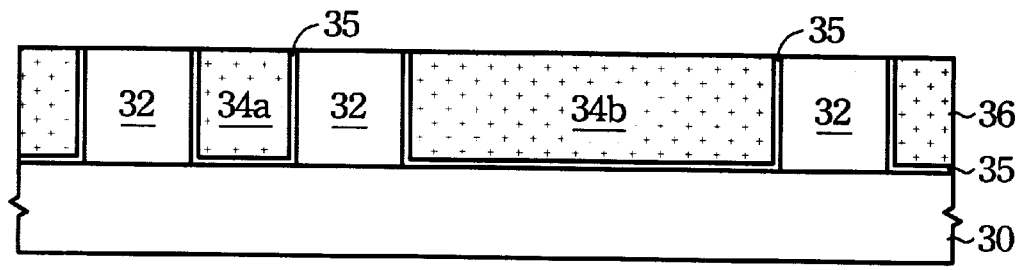
FIG. 6 is a cross section view of a semiconductor wafer illustrating the step of removing the spin-on-glass in accordance with the present invention.

Then, a CMP is performed to polish the spin-on-glass 36 and the dielectric layer 35. A portion of the polishing stop layer 36 may be residual over a wide gap 34b after the planarization of polishing stop 36 and the conductive layer 32. The material over the conductive structure may be removed by well control. The thin spin-on-glass in wide gap 34b region will inhibit polished pad to reach into the wide gap area, thereby eliminating the dishing effect. As shown in FIG. 6, the narrow gap 34a and the wide gap 34b can be planarized such that its top surface is substantially planar with the top surface of the conductive structure. The portion of polishing stop layer over the narrow gap is completely removed. A portion of the polishing stop layer may remains over wide gap 34b. It will make sure that the dishing will not occurs. It is preferred that polishing stop layer 36 is thick enough to prevent the dishing of a wide gap formed in the dielectric layer. It will be appreciated that the slurries and/or the polishing pad is chosen so that the polishing stop layer 36 is polished at a slower rate than the conductive layer.

As is understood by a person skilled in the art, the foregoing preferred embodiment of the present invention is merely illustrative of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a dishing free conductive structure, said method comprising:

patterning a conductive structure having a first gap with a first width and a second gap with a second width formed between thereof, wherein said first width is wider than said second width;

coating a spin-on-material on said conductive structure;

performing a thermal treatment to convert said spin-on-material into an oxide, thereby forming the lowest surface over said first gap to be higher than the surface of said conductive structure;

polishing said spin-on-material by chemical mechanical polishing, wherein said lower surface of said converted spin-on-material layer is higher than said surface of the conductive layer to prevent said first gap from being attacked by a slurry or a pad used during chemical mechanical polishing, wherein said second gap can be planarized such that its top surface is substantially planar with the top surface of said conductive structure, a first portion of said spin-on-material over said second gap is completely removed, and a second portion of said spin-on-material remains over said first gap, thereby reducing dishing effect.

2. The method of claim 1, wherein said spin-on-material includes spin-on-glass.

3. The method of claim 2, wherein said spin-on-glass has a thickness from 500 to 3000 angstroms.

4. The method of claim 1, wherein temperature of said thermal treatment is about 100 to 400 centigrade degree.

5. The method of claim 1, wherein said conductive structure may be selected from the group consisting of aluminum, copper, tungsten, silver, gold, copper and the combination thereof.

6. The method of claim 1, further comprising forming a dielectric layer before coating said spin-on-material.

7. The method of claim 6, wherein said dielectric layer comprises oxide.

8. The method of claim 6, wherein said dielectric layer comprises nitride.

9. The method of claim 6, wherein said dielectric layer comprises oxynitride.

* * * * *